(12) United States Patent
Chou et al.

(10) Patent No.: US 7,102,448 B2
(45) Date of Patent: Sep. 5, 2006

(54) PHASE FREQUENCY DETECTOR USED IN PHASE LOCKED LOOP

(75) Inventors: Yu-Pin Chou, Miao Li County (TW); Yi-Shu Chang, Tai Nan (TW)

(73) Assignee: Realtek Semiconductor Corp., Hsin Chu (TW)

( * ) Notice: Subject to any disclaimer, the term of this patent is extended or adjusted under 35 U.S.C. 154(b) by 0 days.

(21) Appl. No.: 10/812,875

(22) Filed: Mar. 31, 2004

(65) Prior Publication Data
US 2004/0201426 A1    Oct. 14, 2004

(30) Foreign Application Priority Data
Apr. 8, 2003    (TW) .............................. 92108023 A

(51) Int. Cl.
*H03D 13/00*    (2006.01)
(52) U.S. Cl. .............................. 331/25; 327/3; 327/12
(58) Field of Classification Search ................ 331/1 A, 331/1 R, DIG. 2, 16, 18, 25; 327/2, 3, 7, 327/12, 39, 40, 42, 43, 47, 49, 141, 142, 327/162, 163
See application file for complete search history.

(56) References Cited
U.S. PATENT DOCUMENTS

| | | | | |
|---|---|---|---|---|
| 4,105,947 A | * | 8/1978 | Crowley ..................... | 331/1 A |
| 5,950,115 A | * | 9/1999 | Momtaz et al. ............... | 455/73 |
| 5,963,058 A | | 10/1999 | Thomas ........................ | 327/3 |
| 5,963,059 A | * | 10/1999 | Partovi et al. ................ | 327/12 |
| 6,002,273 A | * | 12/1999 | Humphreys .................... | 327/3 |
| 6,147,561 A | | 11/2000 | Rhee et al. .................. | 331/12 |
| 6,157,218 A | * | 12/2000 | Chen .......................... | 327/7 |
| 6,239,634 B1 | * | 5/2001 | McDonagh ................. | 327/158 |
| 6,323,692 B1 | * | 11/2001 | Tsinker ....................... | 327/12 |
| 6,326,826 B1 | * | 12/2001 | Lee et al. .................... | 327/161 |
| 6,404,291 B1 | | 6/2002 | Riley .......................... | 331/11 |
| 6,483,389 B1 | * | 11/2002 | Lamb .......................... | 331/25 |
| 6,617,884 B1 | * | 9/2003 | Wang et al. .................. | 327/12 |
| 6,636,079 B1 | * | 10/2003 | Koyama ........................ | 327/7 |
| 6,683,478 B1 | * | 1/2004 | Yoo ............................ | 327/12 |

* cited by examiner

*Primary Examiner*—Timothy P. Callahan
*Assistant Examiner*—Hai L. Nguyen
(74) *Attorney, Agent, or Firm*—Birch, Stewart, Kolasch & Birch, LLP

(57) ABSTRACT

A phase frequency detector used in a phase locked loop includes a phase error detecting unit for outputting phase error signals according to a phase error between a first input signal and a second input signal, and a reset unit coupled to the phase error detecting unit. The reset unit outputs reset signals according to the first and second input signals so as to reset the phase error detecting unit without delay time. Thus, it is possible to make the output timing of the phase error signal in a more precisely linear proportion to the phase error value and to enhance the sensitivity of the phase locked loop.

11 Claims, 6 Drawing Sheets

PHASE FREQUENCY DETECTOR USED IN PHASE LOCKED LOOP

BACKGROUND OF THE INVENTION

This Nonprovisional application claims priority under 35 U.S.C. § 119(a) on patent application Ser. No(s). 092108023 filed in TAIWAN on Apr. 8, 2003, the entire contents of which are hereby incorporated by reference.

1. Field of the Invention

The invention relates to a Phase Locked Loop (hereinafter called PLL), and more particularly to a phase frequency detector, which has high sensitivity and is applied to a PLL.

2. Description of the Related Art

The Phase Locked Loop (PLL) is an automatic control circuit capable of tracing the frequency and phase of an input signal. The PLL is widely used in computer and consumer products and used in the fields of frequency synthesis, clock/data recovery, clock de-skewing, and the like. The PLL traces the phase and frequency of the input signal and locks the phase and frequency of the output signal so as to keep the phase and frequency of the output signal at a desired value or within a certain range.

There are basically two types of PLLs, which are the analog PLL and the digital PLL. Both the analog PLL and the digital PLL need a phase frequency detector (hereinafter called PFD). FIG. 1A shows a block diagram of a typical digital PLL. The digital PLL includes a PFD 100, a PEQ (Phase Error Quantizer) 110, a DCO (Digital Controller Oscillator) 120 and a divider 130. The PFD 100 is for comparing a feedback signal $F_i$ with an input signal $F_r$ to get a phase error therebetween, and outputting phase error signals according to the phase error. The typical phase error signals includes an UP signal and a DOWN signal, and a phase error value between the feedback signal $F_i$ and the input signal $F_r$ is represented by the values of the two phase error signals and the time difference therebetween. The PEQ 110 quantizes the phase error value and outputs a count signal according to the values of the UP and DOWN signals and the time difference therebetween. The DCO 120 outputs a corresponding output signal $F_o$ according to the value of the count signal. The feedback signal $F_i$ is then obtained by dividing the output signal $F_o$ in the divider 130.

FIG. 1B shows a block diagram of a typical analog PLL, which includes a PFD 150, a charge pump 160, a voltage controller oscillator (hereinafter called VCO) 170 and a divider 180. It is to be noted that the PFD 150 operates in the same way as the digital PLL, with the PEQ 110, the DCO 120, and the functions thereof being substituted by the charge pump 160 and the VCO 170.

FIG. 2 shows a circuit of a conventional PFD, which includes two D-type flip-flops 200 and 210 and an AND gate 220. The signal input terminals D of the flip-flops 200, 210 are coupled to a high-voltage power source. The flip-flop 200 receives the input signal $F_r$ at a clock input terminal CK and generates the phase error signal UP at an output terminal Q. The flip-flop 210 receives the feedback signal $F_i$ at a clock input terminal CK and generates the phase error signal DOWN at an output terminal Q. The AND gate 220 receives the two phase error signals UP and DOWN and generates a reset signal for the two flip-flops 200 and 210. Detailed description concerning the PFD in FIG. 2 can be referred to U.S. Pat. No. 5,963,058, which is incorporated herein by reference.

FIG. 3 is the timing chart showing the operation principle of the PFD. It is assumed that the flip-flops of the phase frequency detector in FIG. 2 are rising-edge triggered elements. Taking that the signal $F_r$ leads the signal $F_i$ as an example, the flip-flop 200 outputs the UP signal with high level when the input signal $F_r$ is turned to high level from low level. The flip-flop 210 outputs the DOWN signal with high level when the input signal $F_i$ is turned to high level from low level. When the UP and DOWN signals are both turned to high level, the AND gate 220 outputs a reset signal that is respectively inputted to the flip-flops 200 and 210 to reset the flip-flops 200 and 210. As a result, the UP and DOWN signals are returned to low level. The operation under the situation when the signal $F_r$ lags behind the signal $F_i$ can be similarly derived.

However, the gate delay inherent in circuit components of the PFD, such as the flip-flops and the AND gate, may significantly degrade the linear relationship between the length of the UP or DOWN signal, and the phase error of the $F_r$ and $F_i$ signals. This may also significantly limit the sensitivity, i.e., the minimum amount of the phase error between the feedback signal $F_i$ and input signal $F_r$ that can be detected by the PLL. When the phase error is smaller than a certain level, it is possible to induce a dead zone condition, in which the UP or DOWN signal outputted from the PFD cannot be utilized by the post-stage circuit, or even cannot be detected by the post-stage circuit owing to the above-mentioned delay nature of the circuit components.

SUMMARY OF THE INVENTION

It is therefore one of the many objects of the invention to provide a PFD used in a PLL, capable of functioning normally even with the phase error being small.

According to embodiments of the present invention, a phase frequency detector is disclosed. The phase frequency detector comprises a phase error detecting unit for outputting a set of phase error signals according to a phase error between a first input signal and a second input signal; and a reset unit coupled to the phase error detecting unit for receiving the first input signal and the second input signal, and for outputting a reset signal according to the first input signal and the second input signal, in order to reset the phase error detecting unit.

These and other objectives of the claimed invention will no doubt become obvious to those of ordinary skill in the art after reading the following detailed description of the preferred embodiment that is illustrated in the various figures and drawings.

DETAILED DESCRIPTION OF THE INVENTION

Figure 1A:
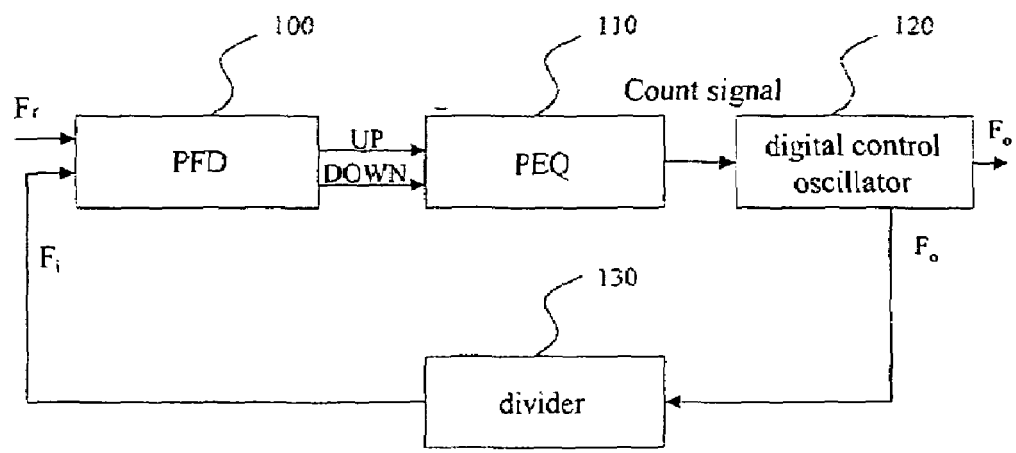
FIG. 1A illustrates a block diagram of a typical digital PLL.
Figure 1B:
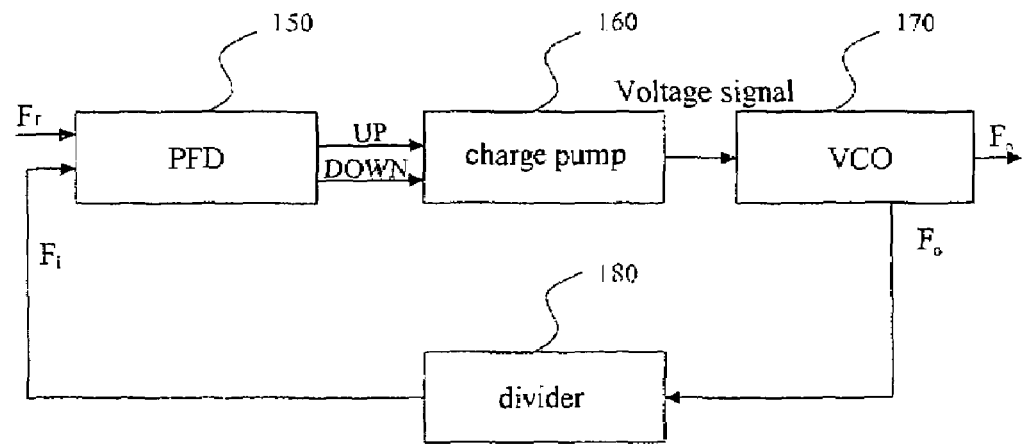
FIG. 1B illustrates a block diagram of a typical analog PLL.
Figure 2:
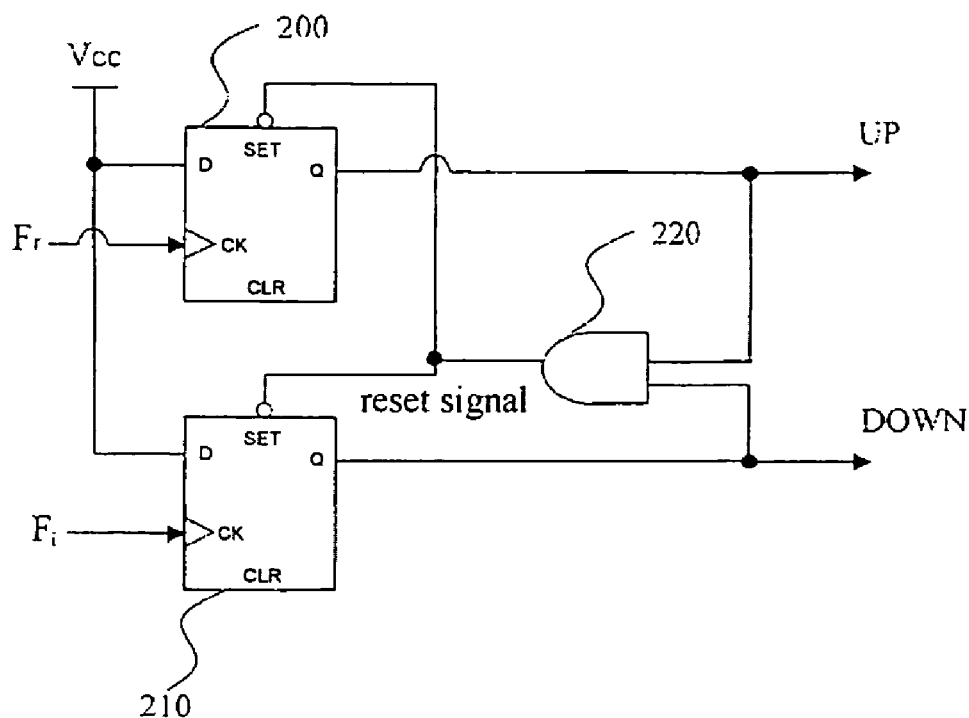
FIG. 2 illustrates a circuit of a conventional PFD.
Figure 3:
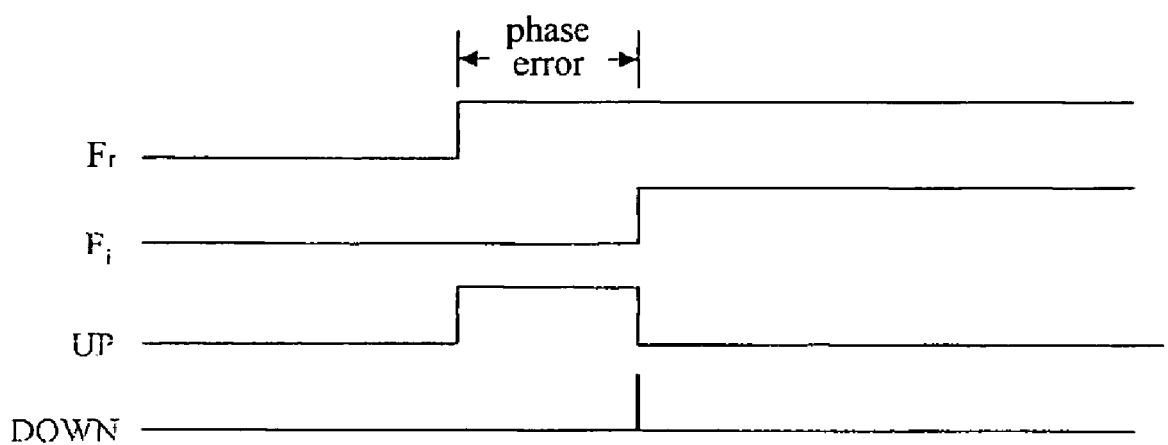
FIG. 3 illustrates a schematic timing chart for the PFD in FIG. 2.
Figure 4:
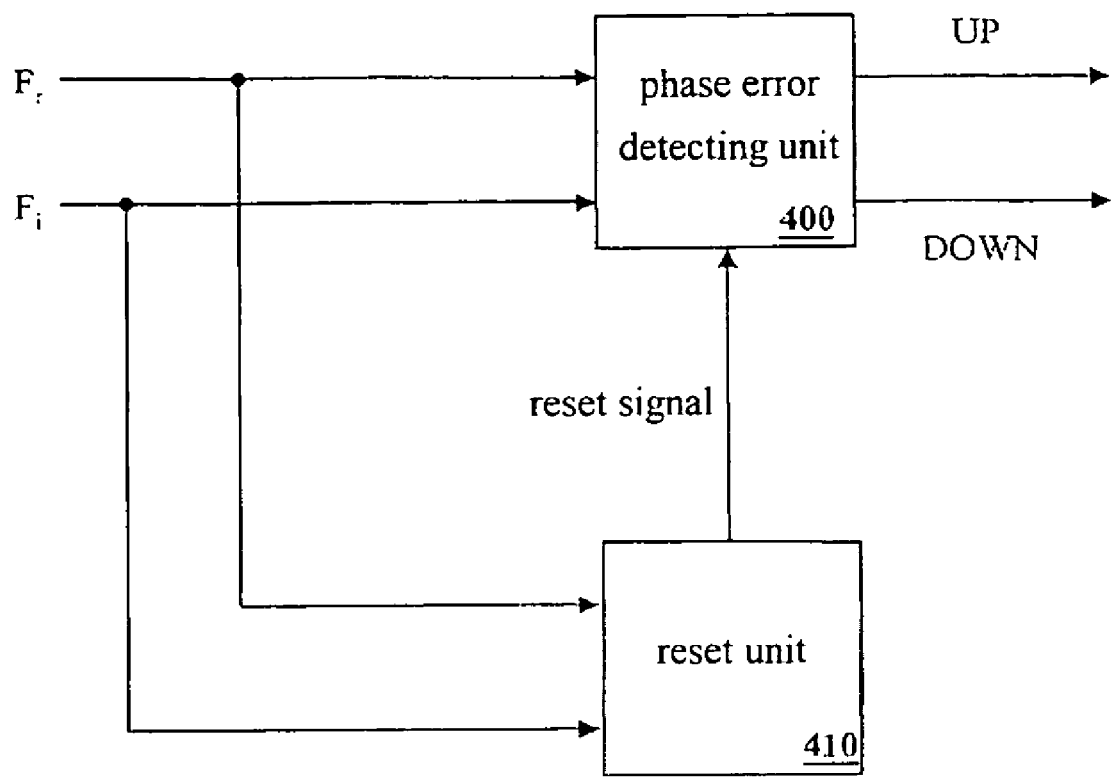
FIG. 4 illustrates a block diagram of a PFD used in a PLL according to an embodiment of the invention.

FIG. 4 illustrates a functional block diagram of a PFD according to an embodiment of the invention. The PFD in FIG. 4 includes a phase error detecting unit 400 and a reset unit 410. The reset unit 410 receives both the input signal $F_r$ and the feedback signal $F_i$ synchronously with the phase error detecting unit 400, and generates a reset signal to reset the phase error detecting unit 400 according to the phase error between the input signal $F_r$ and the feedback signal $F_i$.

Figure 5:
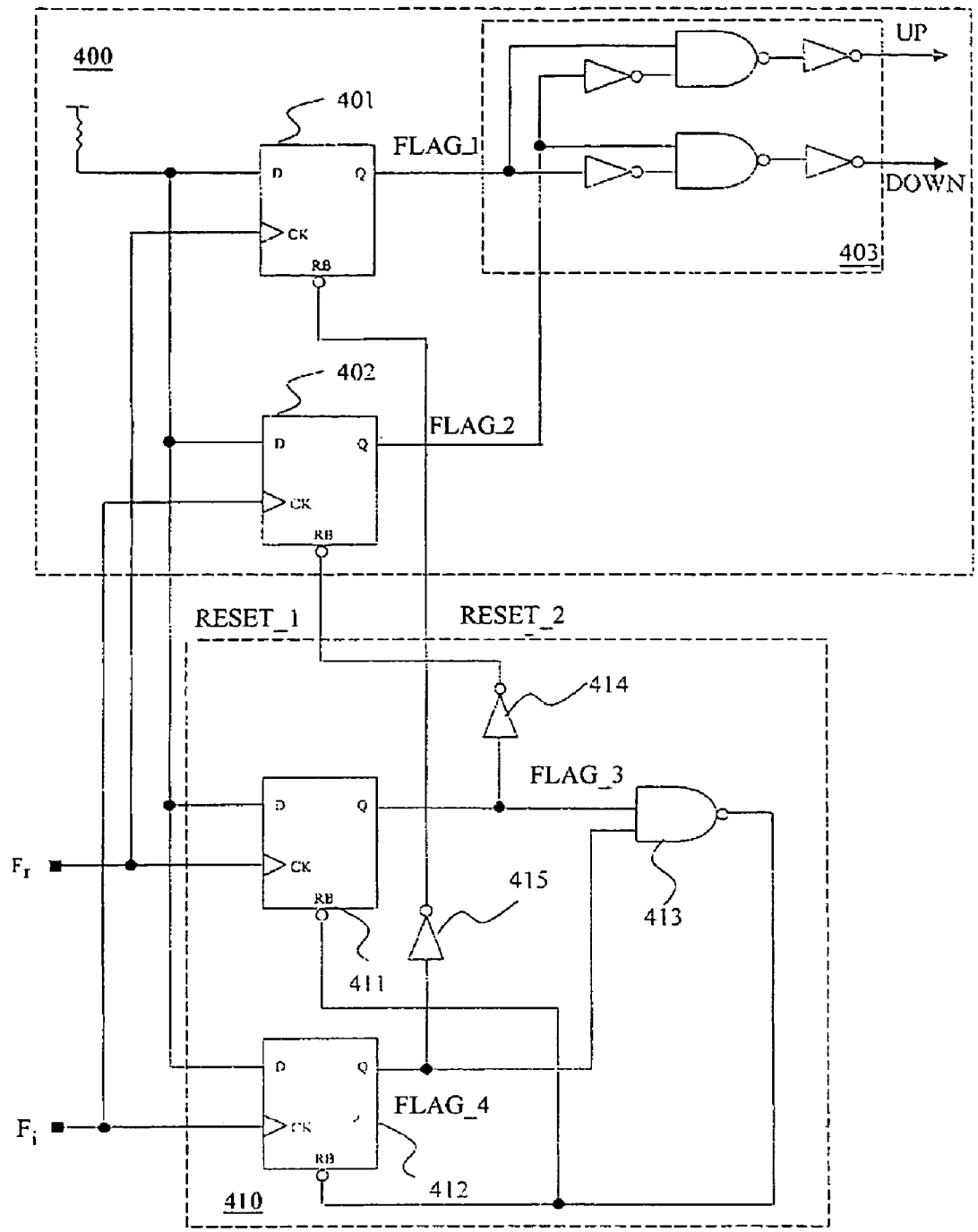
FIG. 5 illustrates a detailed circuit diagram of a PFD circuit used in the PLL in FIG. 4.

FIG. 5 illustrates a detailed circuit diagram of the PFD of FIG. 4. The phase error detecting unit 400 includes a first flip-flop 401, a second flip-flop 402 and a sampling circuit 403. The first flip-flop 401 and the second flip-flop 402 are D-type flip-flops. The signal input terminals D of the flip-flops 401, 402 are coupled to a positive supply voltage source supplying a logic high, while the clock signal input terminals CK of the flip-flops 401, 402 receive the input signal $F_r$ and the feedback signal $F_i$, respectively. Since the operation of the flip-flops 401, 402 is well known to those skilled in the art, detailed descriptions thereof are herein omitted.

The first flip-flop 401 and the second flip-flop 402 output a first flag signal FLAG_1 and a second flag signal FLAG_2, respectively, from the output terminals Q to the sampling circuit 403. The sampling circuit 403 generates an UP signal and a DOWN signal according to the first flag signal FLAG_1 and the second flag signal FLAG_2. When the first flag signal FLAG_1 is turned to high level, the sampling circuit 403 outputs the UP signal with high level and the DOWN signal with low level. When the second flag signal FLAG_2 is turned to high level, the sampling circuit 403 outputs the UP signal with low level and the DOWN signal with high level. The sampling circuit 403 is implemented in this embodiment by, but not limited to, a combinatorial logic as shown in FIG. 5.

In this embodiment, the reset unit 410 includes a third flip-flop 411 and a fourth flip-flop 412, both of which are D-type flip-flops, and the received signals and operations resemble those of the first flip-flop 401 and the second flip-flop 402. The third flip-flop 411 and the fourth flip-flop 412 output a third flag signal FLAG_3 and a fourth flag signal FLAG_4, respectively, to a NAND gate 413. The third flag signal FLAG_3 is further inputted to an inverter 414, which outputs a first reset signal RESET_1 to the second flip-flop 402. The fourth flag signal FLAG_4 is further inputted to an inverter 415, which outputs a second reset signal RESET_2 to the first flip-flop 401. The output terminal of the NAND gate 413 is coupled to the reset terminals of the third flip-flop 411 and the fourth flip-flop 412.

Figure 6:
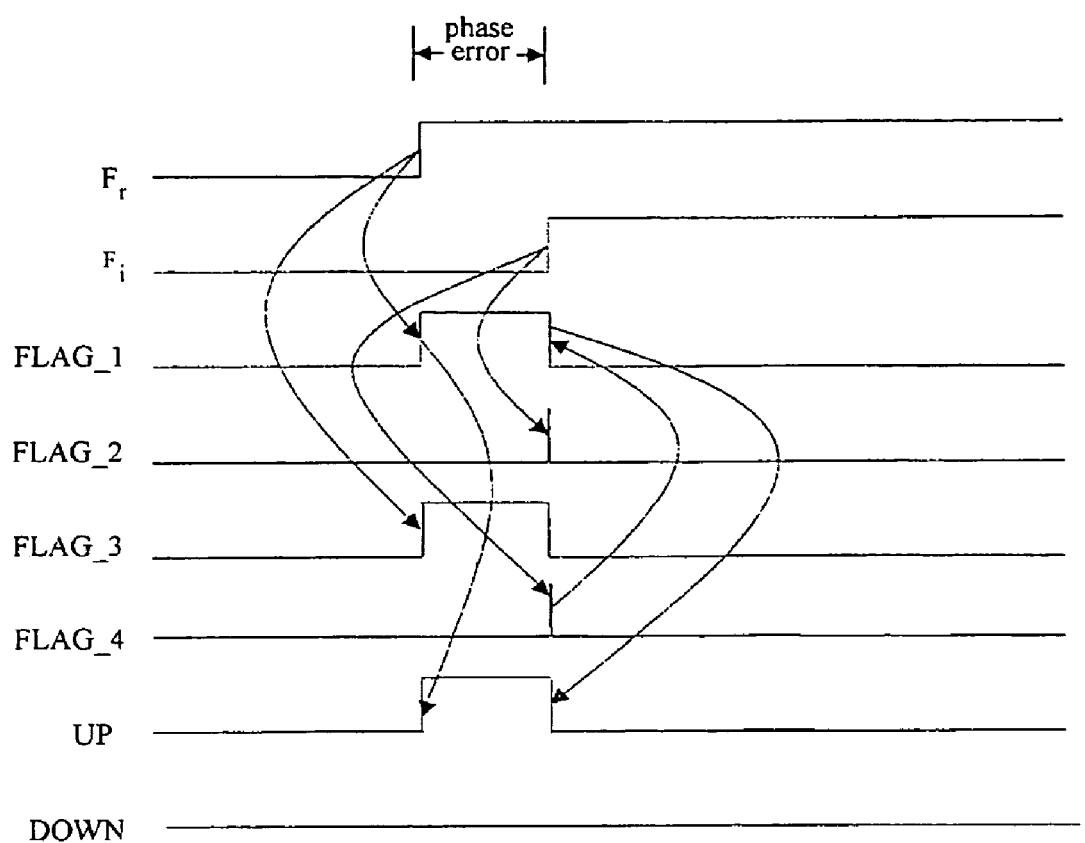
FIG. 6 illustrates a schematic timing chart for the PFD in FIG. 5.

In order to make the explanation with reference to operations, please also refer to timing chart of FIG. 6. It is assumed that the all flip-flops herein are rising-edge triggered device. When the phase of the input signal $F_r$ leads that of the feedback signal $F_i$, the first flip-flop 401 and the third flip-flop 411 simultaneously output a high-level first flag signal FLAG_1 and a high-level third flag signal FLAG_3, respectively. At this time, the sampling circuit 403 outputs a high-level UP signal and a low-level DOWN signal according to the first flag signal FLAG_1. Meanwhile, the high-level third flag signal FLAG_3 resets the second flip-flop 402 via the inverter 414 to keep the second flag signal FLAG_2 at low level. When the phase-lagging feedback signal $F_i$ is turned to high level, the fourth flip-flop 412 outputs a high-level fourth flag signal FLAG_4. At this time, the fourth flag signal FLAG_4 resets the first flip-flop 401 to pull the first flag signal back to the low level via the inverter 415. Therefore, the UP signal outputted from the sampling circuit 403 returns to the low level. Meanwhile, the third flag signal FLAG_3 and the fourth flag signal FLAG_4 are simultaneously inputted to the NAND gate 413, the NAND gate 413 outputs the reset signal to reset the third flip-flop 411 and the fourth flip-flop 412. The operation under the situation when the signal $F_r$ lags behind the signal $F_i$ can be similarly derived.

The first flip-flop 401 of the phase error detecting unit 400 corresponds to the third flip-flop 411 of the reset unit 410. Similarly, the second flip-flop 402 corresponds to the fourth flip-flop 412. Because the received signals and working principles of two flip-flops in a corresponding flip-flop pair are substantially the same, the delay nature of the two may be regarded as being substantially the same. As a result, the potential limitation to sensitivity of the PLL may be minimized, and the linear relationship between the length of the UP or DOWN signal, and the phase error of the $F_r$ and $F_i$ signals may be best preserved.

Figure 7:
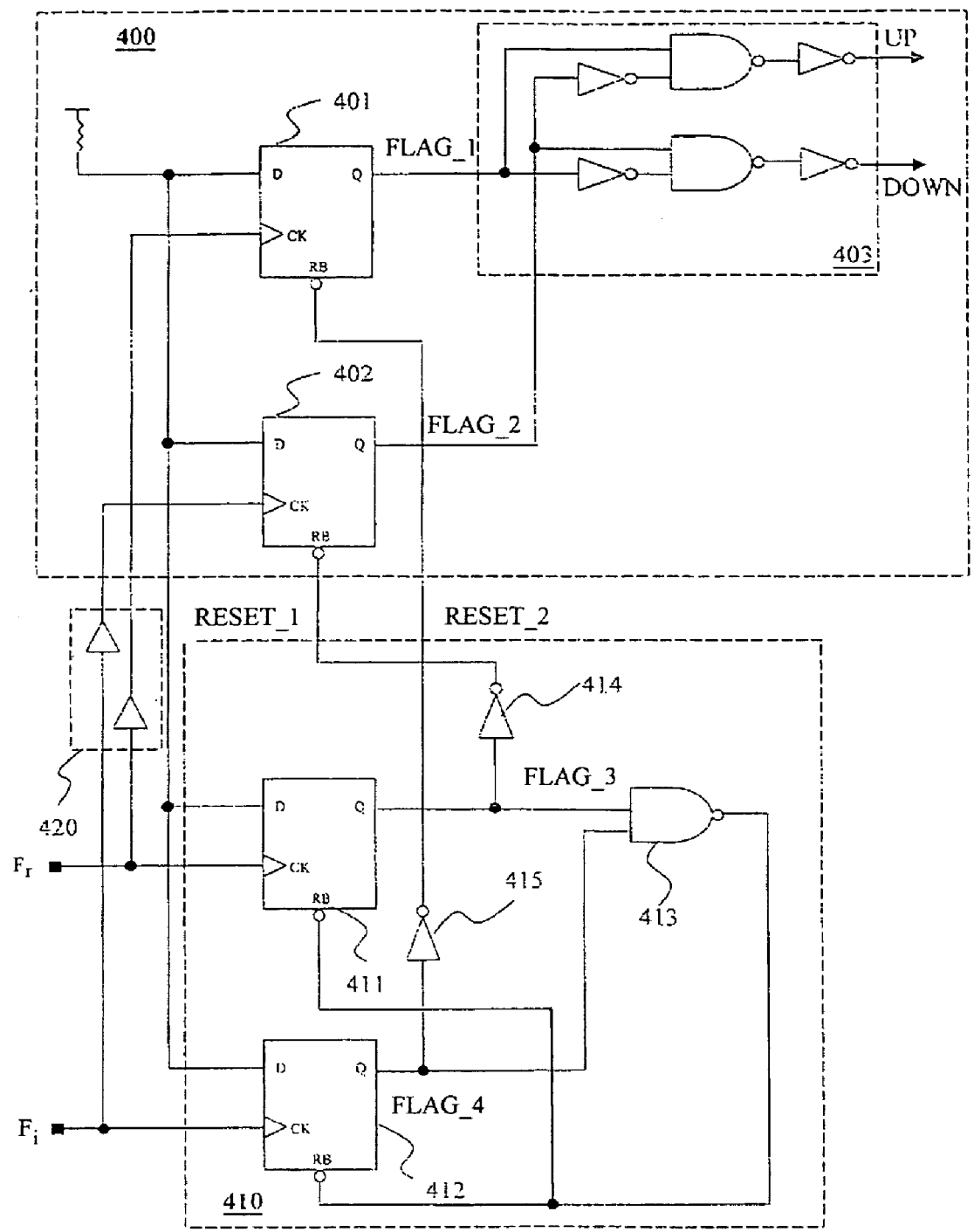
FIG. 7 illustrates another detailed circuit diagram of a PFD circuit used in the PLL in FIG. 4.

The invention further discloses another embodiment, as shown in FIG. 7, wherein a buffer circuit 420 is added in front of the clock input terminals CK of the flip-flops 401, 402 in the phase error detecting unit 400. The function of the buffer circuit 420 delaying the injection of the $F_r/F_i$ signal to the first and the second flip-flops 401, 402 is to compensate for the delay effect caused by the inverters 414 and 415 on the reset signals. As a result, the sensitivity characteristic of the PLL as well as the linear characteristic mentioned above can be further improved.

It is to be noted that the implementation of the invention is illustrated by taking the rising-edge triggered circuit as an example. However, the invention is not limited thereto. The circuit device also may be a falling-edge triggered circuit or a rising/falling-edge triggered circuit, whereof the operations can be reasonably appreciated by those have ordinary skill in the art, and therefore are not detailed herein. In addition, the PFD circuit according to embodiments of the invention may be adapted to the digital PLL and the analog PLL.

While certain exemplary embodiments have been described and shown in the accompanying drawings, it is to be understood that such embodiments are merely illustrative of and not restrictive on the broad invention, and that this invention not be limited to the specific construction and arrangement shown and described, since various other modifications may occur to those ordinarily skilled in the art.

What is claimed is:

1. A phase frequency detector comprising:
   a phase error detecting unit for outputting at least a phase error signal according to a phase error between a first input signal and a second input signal; and
   a reset unit coupled to the phase error detecting unit for receiving the first input signal and the second input signal, and for outputting reset signals according to the first input signal and the second input signal, in order to reset the phase error detecting unit;
   wherein the phase error detecting unit comprises:
      a first flip-flop for outputting a first flag signal according to the first input signal;
      a second flip-flop for outputting a second flag signal according to the second input signal; and
      a sampling circuit for outputting the phase error signal according to the first flag signal and the second flag signal;

wherein the length of the phase error signal has a substantial linear relationship with the phase error of the first input signal and the second input signal;

wherein the phase error detecting unit is reset by the reset signal responsive to an edge of the first input signal, and remains reset for a significant period of time despite of the level of the first input signal after said edge.

2. The phase frequency detector according to claim 1, wherein the phase error signal comprises a first output signal and a second output signal.

3. The phase frequency detector according to claim 1, wherein the phase error detecting unit further comprises a buffer circuit for buffering the first input signal and the second input signal.

4. The phase error detector according to claim 1, wherein the time from a state transition of the first input signal to a corresponding reset of the phase error detecting unit is substantially the same as the time from the state transition of the first input signal to a corresponding state transition of the first flag signal.

5. The phase frequency detector according to claim 1, wherein the reset signals comprise:
   a first reset signal for resetting the first flip-flop; and
   a second reset signal for resetting the second flip-flop.

6. The phase frequency detector according to claim 5, wherein the reset unit comprises:
   a third flip-flop for outputting the second reset signal according to the first input signal; and
   a fourth flip-flop for outputting the first reset signal according to the second input signal.

7. A phase frequency detector comprising:
   a phase error detecting unit for outputting at least a phase error signal according to a phase error between a first input signal and a second input signal; and
   a reset unit coupled to the phase error detecting unit for receiving the first input signal and the second input signal, and for outputting a first reset signal and a second reset signal according to the first input signal and the second input signal, in order to reset the phase error detecting unit;
   wherein the phase error detecting unit comprises:
   a first flip-flop for outputting a first flag signal according to the first input signal; and
   a second flip-flop for outputting a second flag signal according to the second input signal;
   wherein the first reset signal resets the first flip-flop and the second reset signal resets the second flip-flop;
   wherein the reset unit comprises:
   a third flip-flop for outputting the second reset signal for resetting the second flip-flop according to the first input signal; and
   a fourth flip-flop for outputting the first reset signal for resetting the first flip-flop according to the second input signal;
   wherein the length of the phase error signal has a substantial linear relationship with the phase error of the first input signal and the second input signal;
   wherein the phase error detecting unit is reset by the reset signal responsive to an edge of the first input signal, and remains reset for a significant period of time despite of the level of the first input signal after said edge.

8. The phase frequency detector according to claim 7, wherein the phase error detecting unit further comprises a buffer circuit for buffering the first input signal and the second input signal.

9. The phase error detector according to claim 7, wherein the time from a state transition of the first input signal to a corresponding reset of the phase error detecting unit is substantially the same as the time from the state transition of the first input signal to a corresponding state transition of the first flag signal.

10. The phase frequency detector according to claim 7, wherein the phase error signal comprises a first output signal and a second output signal.

11. The phase frequency detector according to claim 10, wherein the phase error detecting unit further comprises a sampling circuit for outputting the first output signal and the second output signal according to the first flag signal and the second flag signal.

* * * * *